(12) United States Patent
Chen et al.

(10) Patent No.: US 9,024,416 B2
(45) Date of Patent: May 5, 2015

(54) SEMICONDUCTOR STRUCTURE

(71) Applicant: United Microelectronics Corp., Hsinchu (TW)

(72) Inventors: Chun-Hung Chen, Tainan (TW); Ming-Tse Lin, Hsinchu (TW); Chien-Li Kuo, Hsinchu (TW); Kuei-Sheng Wu, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/964,184

(22) Filed: Aug. 12, 2013

(65) Prior Publication Data
US 2015/0041952 A1  Feb. 12, 2015

(51) Int. Cl.
| | | |
|---|---|---|
| H01L 23/552 | (2006.01) | |
| H01L 21/00 | (2006.01) | |
| H01L 23/60 | (2006.01) | |
| H01L 49/02 | (2006.01) | |
| H01L 23/14 | (2006.01) | |
| H01L 23/498 | (2006.01) | |
| H01L 23/64 | (2006.01) | |
| H01L 23/522 | (2006.01) | |

(52) U.S. Cl.
CPC ............... H01L 23/60 (2013.01); H01L 28/10 (2013.01); H01L 23/147 (2013.01); H01L 23/49822 (2013.01); H01L 23/49827 (2013.01); H01L 23/5225 (2013.01); H01L 23/5227 (2013.01); H01L 23/645 (2013.01)

(58) Field of Classification Search
USPC ............... 438/3, 59; 257/659–663, E23.001
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |

(Continued)

*Primary Examiner* — Calvin Lee
(74) *Attorney, Agent, or Firm* — WPAT, PC; Justin King

(57) ABSTRACT

A semiconductor structure is provided. The semiconductor structure includes an interposer structure. The interposer structure includes an interposer substrate, a ground, through vias, a dielectric layer, and an inductor. The through vias are formed in the interposer substrate and electrically connected to the ground. The dielectric layer is on the interposer substrate. The inductor is on the dielectric layer.

17 Claims, 7 Drawing Sheets

(56) References Cited

U.S. PATENT DOCUMENTS

| | | |
|---|---|---|
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham et al. |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 8,026,592 B2 | 9/2011 | Yoon |
| 8,034,708 B2 | 10/2011 | Kuo |
| 8,049,327 B2 | 11/2011 | Kuo |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 8,362,599 B2 * | 1/2013 | Kim et al. .................. 257/660 |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2007/0281438 A1 * | 12/2007 | Liu et al. .................. 438/455 |
| 2008/0073747 A1 | 3/2008 | Chao |
| 2008/0108193 A1 | 5/2008 | You |
| 2009/0090995 A1 | 4/2009 | Yang |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0244247 A1 | 9/2010 | Chang |
| 2010/0295151 A1 * | 11/2010 | Kurokawa .................. 257/531 |
| 2010/0323478 A1 | 12/2010 | Kuo |

* cited by examiner

SEMICONDUCTOR STRUCTURE

BACKGROUND

1. Technical Field

The disclosure relates to a semiconductor structure, and more particularly to an interposer having a ground shielding structure for an inductor.

2. Description of the Related Art

An inductor is a passive two-terminal electrical element which resists changes in electric current passing through it. When a current flows through it, energy is stored in a magnetic field in the coil. When the current flowing through an inductor changes, the time-varying magnetic field induces a voltage in the conductor.

A quality factor (or Q factor) of an inductor is a ratio of its inductive reactance to its resistance at a given frequency, and is a measure of its efficiency. The higher the Q factor of the inductor, the closer it approaches the behavior of an ideal, lossless, inductor.

SUMMARY

According to one aspect of the present disclosure, a semiconductor structure is provided. The semiconductor structure comprises an interposer structure. The interposer structure comprises an interposer substrate, a ground, through vias, a dielectric layer, and an inductor. The through vias are formed in the interposer substrate and electrically connected to the ground. The dielectric layer is on the interposer substrate. The inductor is on the dielectric layer.

The above and other aspects of the disclosure will become better understood with regard to the following detailed description of the non-limiting embodiment(s). The following description is made with reference to the accompanying drawings.

DETAILED DESCRIPTION

Figure 1A:
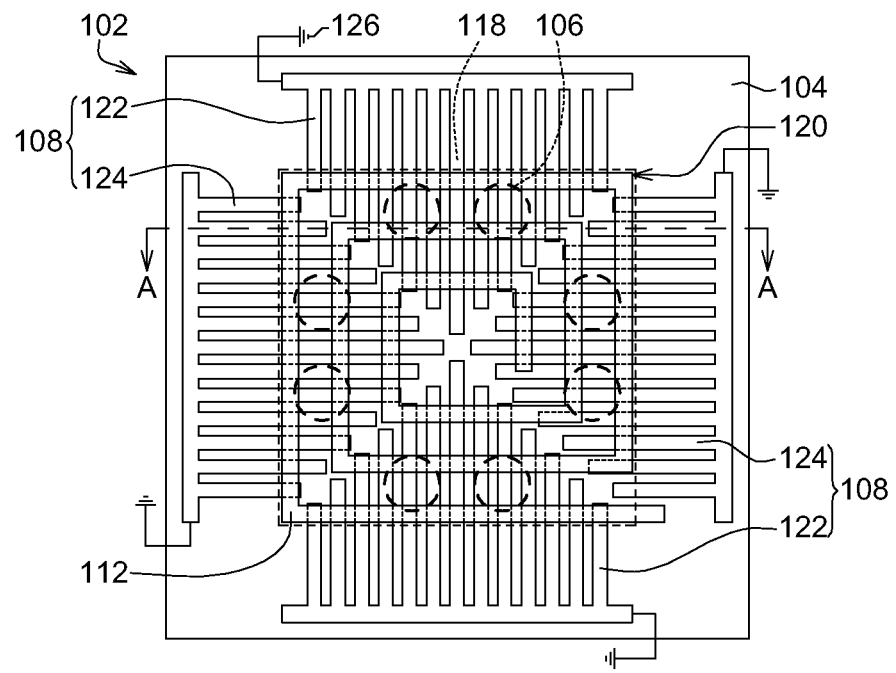
FIG. 1A illustrates a top view of an interposer structure according to one embodiment.
Figure 1B:
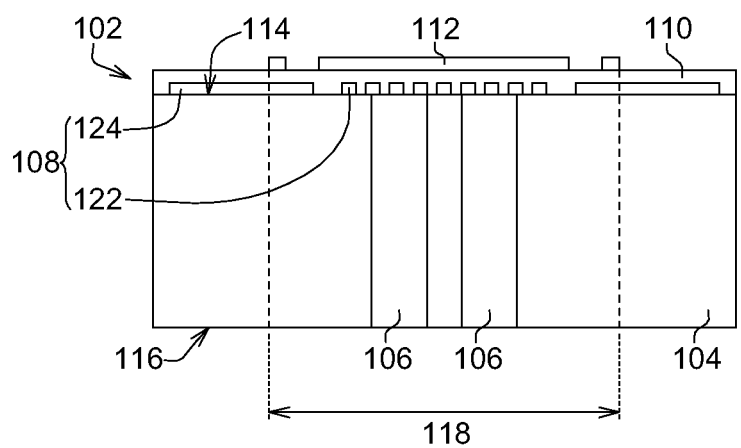
FIG. 1B illustrate a cross-section view of an interposer structure according to one embodiment.

FIG. 1A illustrates a top view of an interposer structure 102 according to one embodiment. FIG. 1B illustrate a cross-section view of the interposer structure 102 along AA line in FIG. 1A according to one embodiment.

Referring to FIG. 1B, the interposer structure 102 comprises an interposer substrate 104, through vias 106, a conductive layer 108, a dielectric layer 110, and an inductor 112. The through vias 106 are formed in the interposer substrate 104. In one embodiment, the interposer substrate 104 comprises silicon or other suitable materials. For example, the interposer substrate 104 is a silicon substrate without a doped well therein. In one embodiment, the interposer substrate 104 has only the through vias 106 and another through vias inside. For example, the through vias 106 are formed by lasing or etching openings in the interposer substrate 104, forming an insulating material on sidewalls of the openings, and filling the openings with a conductive material such as a metal. The through vias 106 are extended from a top surface 114 to a bottom surface 116 of the interposer substrate 104 as shown in FIG. 1A.

Referring to FIG. 1B, the conductive layer 108 is formed on the interposer substrate 104 and electrically connected to the through vias 106. The conductive layer 108 may comprise a metal. The dielectric layer 110 is formed on the interposer substrate 104 and the conductive layer 108. The dielectric layer 110 may comprise an oxide or a nitride, such as silicon oxide, silicon nitride, or other suitable dielectric materials. The inductor 112 is disposed on the dielectric layer 110, and electrically insulated from the through vias 106 by the dielectric layer 110.

Referring to FIG. 1A, the through vias 106 are formed in a region 118 of the interposer substrate 104 overlapping a region defined by an outside edge 120 of the inductor 112. The through vias 106 are arranged in a hollow square shape configuration as shown in FIG. 1A. The conductive layer 108 comprises first conductive lines 122 extending in a first direction and second conductive lines 124 extending in a second direction different from the first direction. The first direction may be perpendicular to the second direction. The first conductive lines 122 and the second conductive lines 124 are perpendicular to the inductor 112. The conductive layer 108 is not limited to the four conductive combs (two of them each comprise the first conductive lines 122, and the others each comprise the second conductive lines 124) separated from each other as shown in FIG. 1A, and may have other amounts of the conductive combs or/and shapes. The through vias 106 may be electrically connected to grounds 126 through the conductive layer 108. Each of the through vias 106 is electrically connected with one of the conductive combs, that is, the conductive combs are not electrically connected to each other in series through the through vias 106. Through vias 106 and the conductive layer 108 form a ground shielding structure for the inductor 112, and thus quality factor (Q factor) of the inductor 112 can be improved.

Figure 1C:
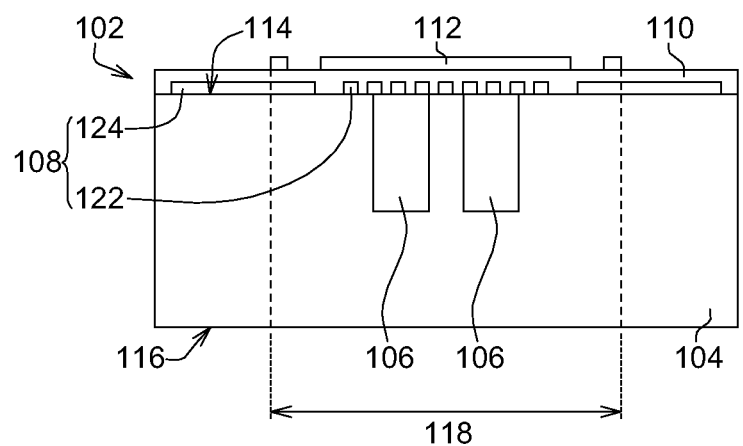
FIG. 1C illustrate a cross-section view of an interposer structure according to one embodiment.

In other embodiments, the interposer structure 102 as shown in FIG. 1A along AA line may have a cross-section view as shown in FIG. 1C. The cross-section view of FIG. 1C is different from the cross-section view of FIG. 1B in that the through vias 106 are extended from the top surface 114 to an interior of the interposer substrate 104. In other words, the through vias 106 do not reach the bottom surface 116 of the interposer substrate 104. Through vias 106 and the conductive layer 108 form a ground shielding structure for the inductor 112, and thus Q factor of the inductor 112 can be improved.

Figure 2:
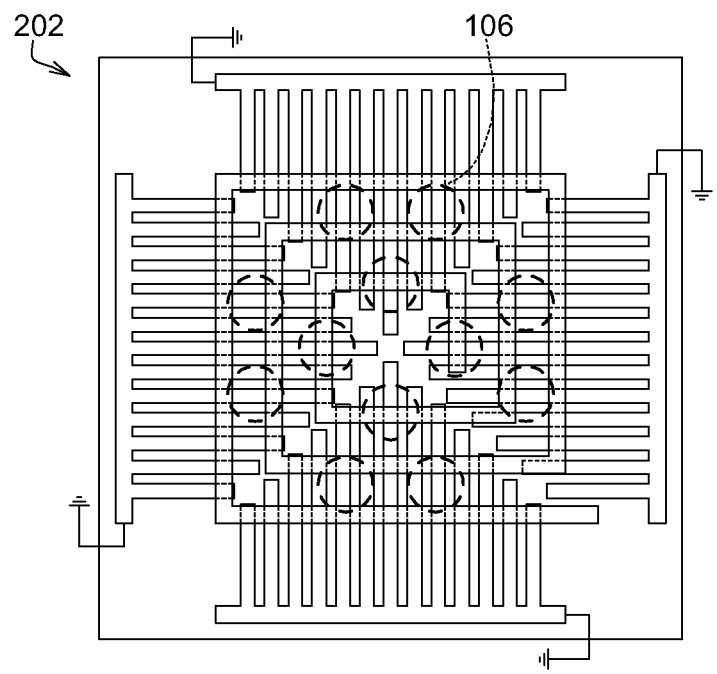
FIG. 2 illustrates a top view of an interposer structure according to one embodiment.

FIG. 2 illustrates a top view of an interposer structure 202 according to one embodiment. The interposer structure 202 as shown in FIG. 2 is different from the interposer structure 102 as shown in FIG. 1A in that through vias 106 are arranged in a row-and-column array configuration.

Figure 3:
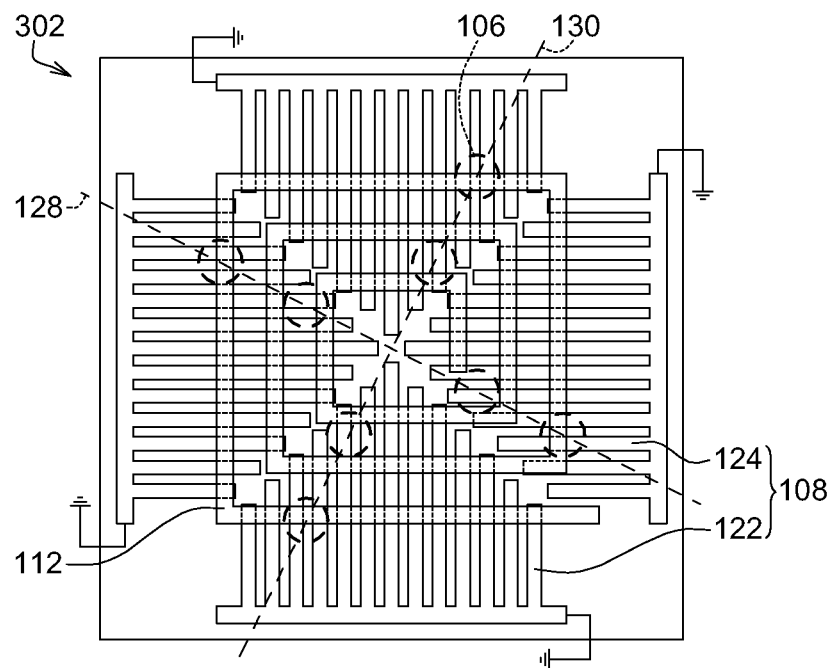
FIG. 3 illustrates a top view of an interposer structure according to one embodiment.

FIG. 3 illustrates a top view of an interposer structure 302 according to one embodiment. The interposer structure 302 as shown in FIG. 3 is different from the interposer structure 102 as shown in FIG. 1A in that through vias 106 are arranged in a cross shape configuration. Imaginary axis 128 and 130 that the through vias 106 align with are not perpendicular to the inductor 112. For example, the first conductive lines 122 or the second conductive lines 124 of the conductive layer 108 may have an included angle, such as 30° or other suitable angles, with the inductor 112.

Figure 4:
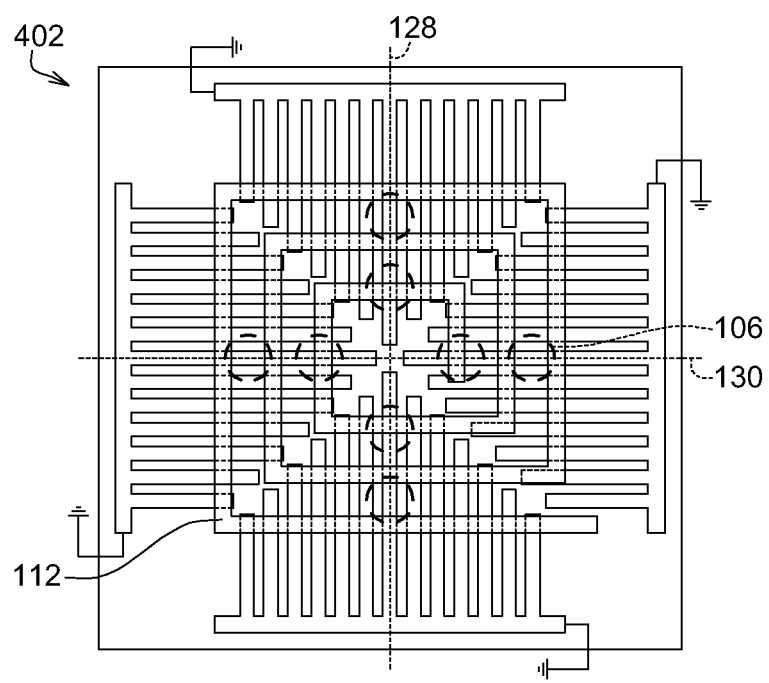
FIG. 4 illustrates a top view of an interposer structure according to one embodiment.

FIG. 4 illustrates a top view of an interposer structure 302 according to one embodiment. The interposer structure 302 as shown in FIG. 4 is different from the interposer structure 102 as shown in FIG. 1A in that through vias 106 are arranged in a cross shape configuration. Imaginary axis 128 and 130 that the through vias 106 align with are perpendicular to the inductor 112.

Figure 5:
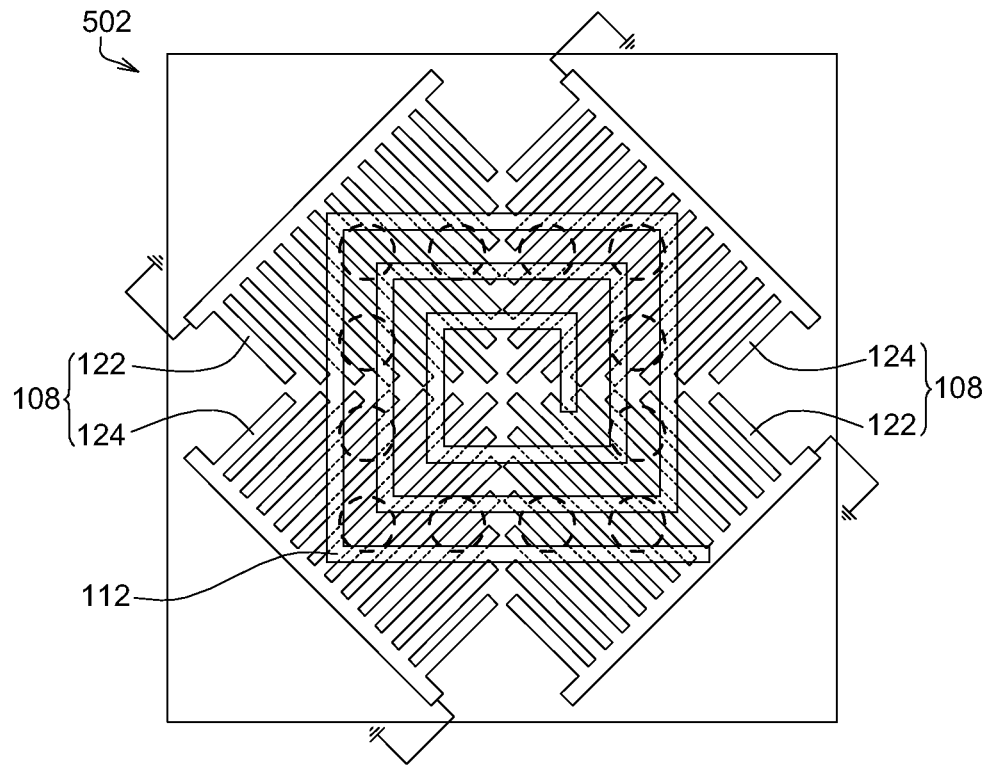
FIG. 5 illustrates a top view of an interposer structure according to one embodiment.

FIG. 5 illustrates a top view of an interposer structure 502 according to one embodiment. The interposer structure 502 as shown in FIG. 5 is different from the interposer structure 102 as shown in FIG. 1A in that the first conductive lines 122 and the second conductive lines 124 are not perpendicular to the inductor 112. For example, the first conductive lines 122 or the second conductive lines 124 may have an included angle, such as 45° or other suitable angles, with the inductor 112.

Figure 6A:
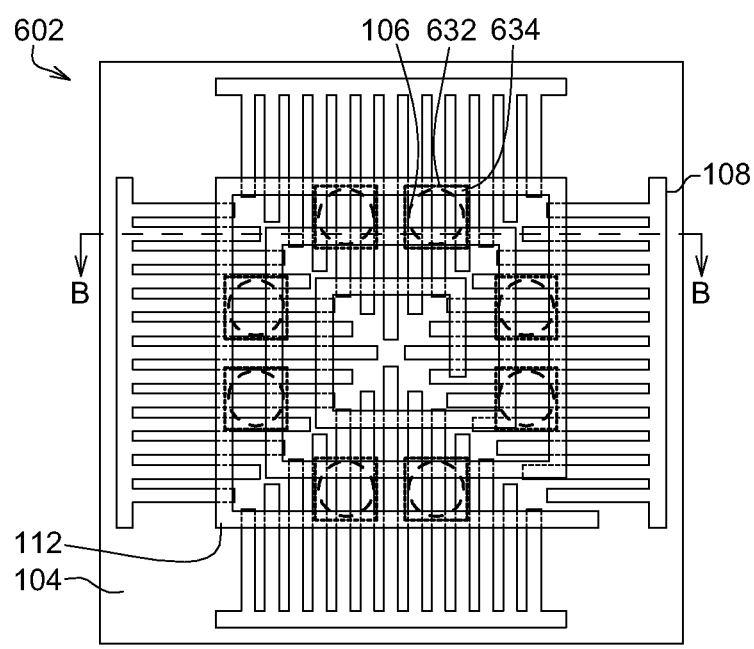
FIG. 6A illustrates a top view of an interposer structure according to one embodiment.
Figure 6B:
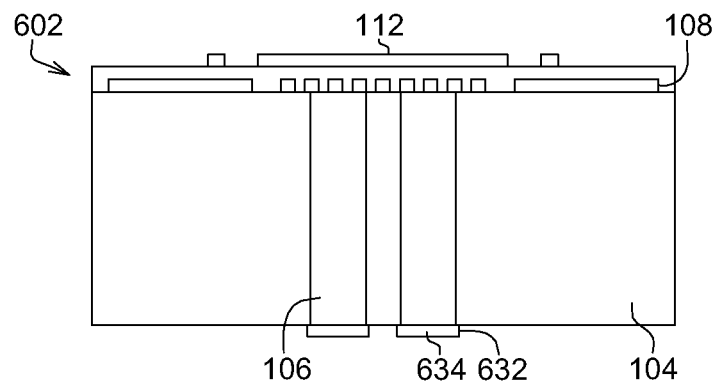
FIG. 6B illustrate a cross-section view of an interposer structure according to one embodiment.

FIG. 6A illustrates a top view of an interposer structure 602 according to one embodiment. FIG. 6B illustrate a cross-section view of the interposer structure 602 along BB line in FIG. 6A according to one embodiment. The embodiment as shown in FIGS. 6A and 6B is different from the embodiment as shown in FIGS. 1A and 1B in that the interposer structure 602 comprises a conductive layer 632 under the interposer substrate 104. The conductive layer 632 may comprise a redistribution layer (RDL) comprising conductive pads 634 corresponding to the through vias 106. The conductive pads 634 may be electrically connected to conductive routing lines (not shown) of the conductive layer 632. The conductive layer 632 comprises a metal. The through vias 106 may be electrically connected to grounds (not shown) through the conductive layer 632. Through vias 106, the conductive layer 108, and the conductive layer 632 form a ground shielding structure for the inductor 112, and thus the Q factor of the inductor 112 can be improved.

Figure 7A:
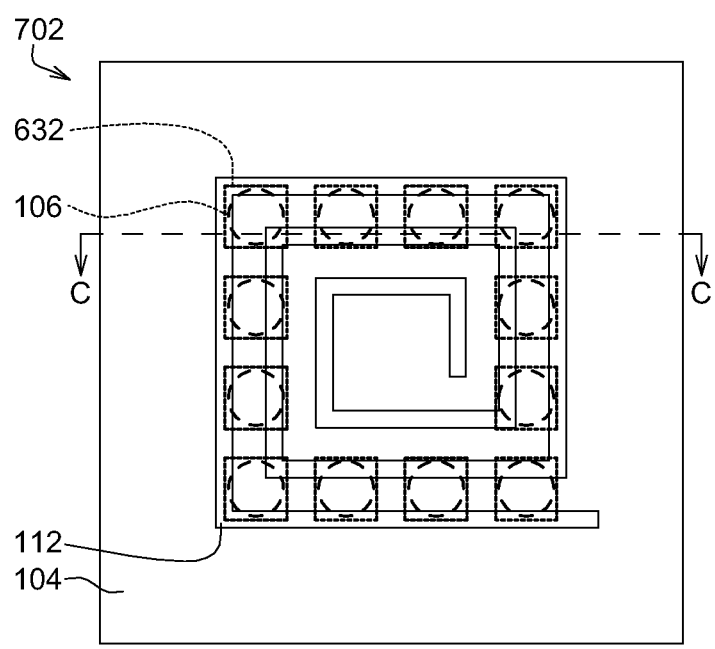
FIG. 7A illustrates a top view of an interposer structure according to one embodiment.
Figure 7B:
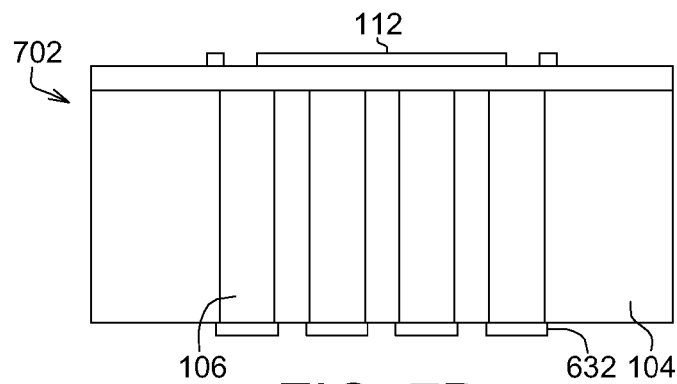
FIG. 7B illustrate a cross-section view of an interposer structure according to one embodiment.

FIG. 7A illustrates a top view of an interposer structure 702 according to one embodiment. FIG. 7B illustrate a cross-section view of the interposer structure 702 along CC line in FIG. 7A according to one embodiment. The embodiment as shown in FIGS. 7A and 7B is different from the embodiment as shown in FIGS. 6A and 6B in that the conductive layer 108 on the interposer substrate 104 is omitted. Through vias 106 and the conductive layer 632 form a ground shielding structure for the inductor 112, and thus the Q factor of the inductor 112 can be improved.

In embodiments, the elements of the interposer structure may be varied according to actual demands properly. For example, the inductor is not limited to a square spiral coil as shown in figures, and may comprise a circular spiral coil, a rectangular spiral coil, a hexagonal spiral coil, an octagonal spiral coil, or other suitable shapes. In other embodiments, the through vias are arranged in a hollow rectangular shape configuration, a hollow hexagonal shape configuration, a hollow octagonal shape configuration, or other suitable configurations from a top view of an interposer structure (not shown).

The interposer structure according to embodiments can be applied to a semiconductor structure.

Figure 8:
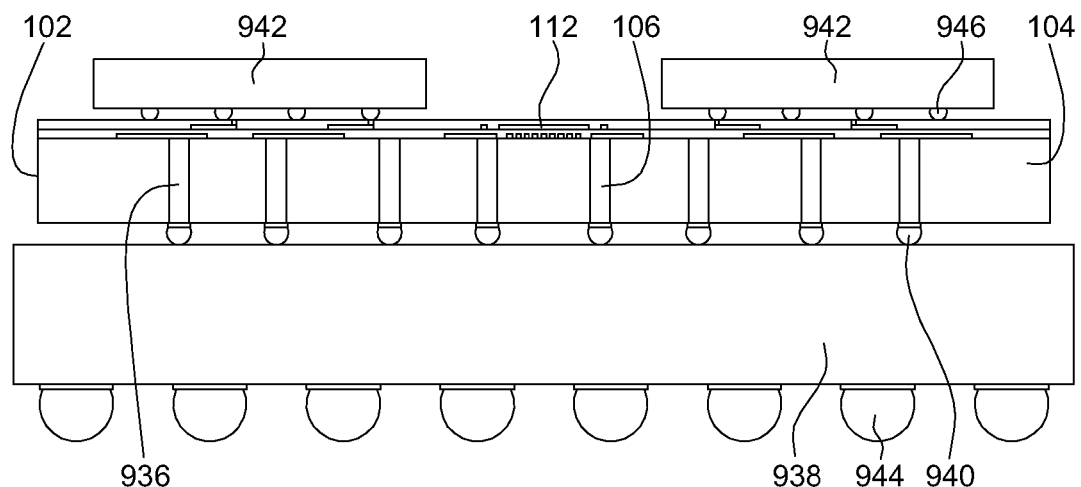
FIG. 8 is a diagram showing a semiconductor structure using an interposer structure according to one embodiment.

Referring to FIG. 8, for example, the interposer structure 102 may be disposed on a package substrate 938 such as PCB. Through vias 936 may be formed in the interposer substrate 104 under a region outside the inductor 112 (such as the region outside the region 118 in FIG. 1A). The through vias 106 and 936 may be electrically connected to the package substrate 938 through solder balls 940, etc. The interposer structure 102 may use embedded passive technique. For example, at least one device chip 942 may be disposed on the interposer structure 102 and electrically connected to solder balls 944 through solder balls 946, the through vias 936, the solder balls 940, and other suitable conductive interconnections. The device chip 942 may comprise a SRAM, a logic circuit, or other suitable device circuits. The grounds that the conductive layer is electrically connected to may be routed through the device chip 942 or the package substrate 938.

Figure 9:
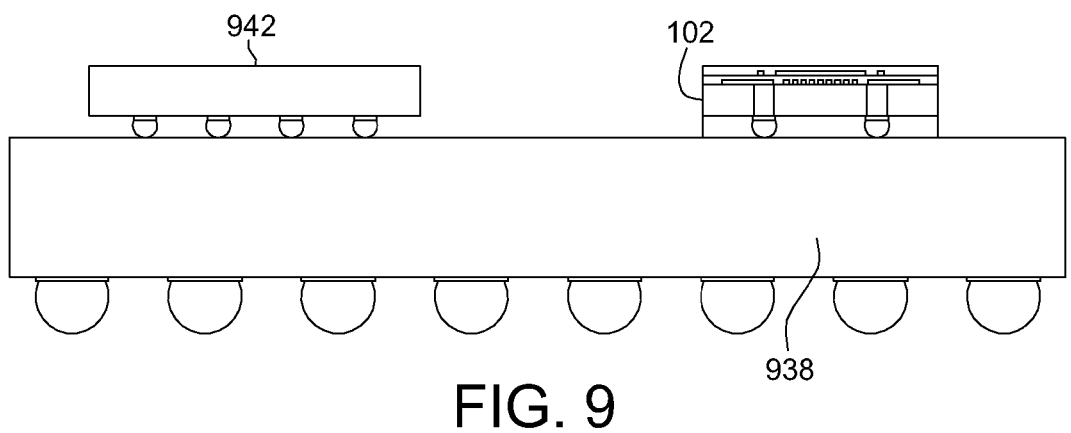
FIG. 9 is a diagram showing a semiconductor structure using an interposer structure according to one embodiment.

A semiconductor structure as shown in FIG. 9 is different from the semiconductor structure as shown in FIG. 8 in that the interposer structure 102 and the device chip 942 is disposed on and electrically connected to the package substrate 938 such as PCB, etc.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure comprised of an interposer structure comprising:
    an interposer substrate;
    a ground;
    through vias formed in the interposer substrate and electrically connected to the ground;
    a dielectric layer on the interposer substrate; and
    an inductor on the dielectric layer,
wherein the inductor is electrically insulated from the through vias by the dielectric layer;
wherein the interposer structure further comprises a conductive layer on or under the interposer substrate, the through vias are electrically connected to the ground through the conductive layer; and
wherein the conductive layer on the interposer substrate comprises first conductive lines extending in a first direction and second conductive lines extending in a second direction different from the first direction.

2. The semiconductor structure according to claim 1, wherein the through vias are formed in a region of the interposer substrate overlapping a region defined by an outside edge of the inductor.

3. The semiconductor structure according to claim 1, wherein the first conductive lines and the second conductive lines are perpendicular to the inductor.

4. The semiconductor structure according to claim 1, wherein the conductive layer under the interposer substrate comprises a redistribution layer (RDL) comprising conductive pads corresponding to the through vias.

5. The semiconductor structure according to claim 1, wherein the conductive layer comprises a metal.

6. The semiconductor structure according to claim 1, wherein the through vias are extended from a top surface to a bottom surface of the interposer substrate.

7. The semiconductor structure according to claim 1, wherein the through vias are extended from a top surface to an interior of the interposer substrate.

8. The semiconductor structure according to claim 1, wherein the inductor comprises a square spiral coil, a rectangular spiral coil, a hexagonal spiral coil or an octagonal spiral coil.

9. The semiconductor structure according to claim 1, wherein the ground comprises a plurality of the grounds, the through vias are electrically connected to the grounds respectively.

10. The semiconductor structure according to claim 1, wherein the interposer substrate is a silicon substrate without a doped well therein.

11. The semiconductor structure according to claim 1, wherein the interposer substrate comprises silicon.

12. The semiconductor structure according to claim 1, wherein the interposer substrate has only the through vias inside.

13. The semiconductor structure according to claim 1, wherein the through vias are arranged in a cross shape configuration, a row-and-column array configuration, or a hollow square, hollow rectangular, hollow hexagonal or hollow octagonal shape configuration.

14. The semiconductor structure according to claim 13, wherein the cross shape configuration of the through vias are perpendicular to the inductor.

15. The semiconductor structure according to claim 1, further comprising a package substrate disposed on and electrically connected to the interposer structure.

16. The semiconductor structure according to claim 15, further comprising a device chip disposed on the package substrate or the interposer structure.

17. The semiconductor structure according to claim 16, wherein the device chip comprises a SRAM or a logic circuit.

\* \* \* \* \*